United States Patent [19]
Huang et al.

[11] Patent Number: 6,135,702
[45] Date of Patent: Oct. 24, 2000

[54] APPARATUS FOR AUTOMATED LOADING OF WAFER CASSETTE

[75] Inventors: Gwo-Jou Huang, Hsinchu; Ping-Yu Hu, Kaohsiung; Ton-Li Lee, Hsin-chu; Chen-Shin Lin, Taichung, all of Taiwan

[73] Assignee: Taiwan Semiconductor Manufacturing Company, Ltd., Hsin Chu, Taiwan

[21] Appl. No.: 09/089,498

[22] Filed: Jun. 3, 1998

[51] Int. Cl.[7] .............................. B65G 49/07; B25J 19/06
[52] U.S. Cl. .......................... 414/729; 414/940; 901/13; 901/49
[58] Field of Search ................................. 414/729, 940; 901/11, 12, 13, 25, 49

[56] References Cited

U.S. PATENT DOCUMENTS 4,343,584  8/1982  Hudgins ................................. 901/25 X Primary Examiner—F. J. Bartuska
Attorney, Agent, or Firm—Tung & Associates

[57] ABSTRACT

An apparatus for preventing the over-tilt of a gripper assembly in a cassette loading device is described. The apparatus provides an additional sensor arm system rigidly mounted to the gripper assembly such that the additional sensor arm not only provides a method for it to reach an over-tilt position, but also provides a mechanical stop to manually stop the gripper assembly from making further motion beyond the maximum downward-tilt position of the arm. The apparatus may further be provided with a warning system and a manual override device such that a machine operator may be alerted of the over-tilt condition and further, may manually override the sensor system by temporarily restoring power to the gripper assembly and returning it to a safe position.

18 Claims, 3 Drawing Sheets

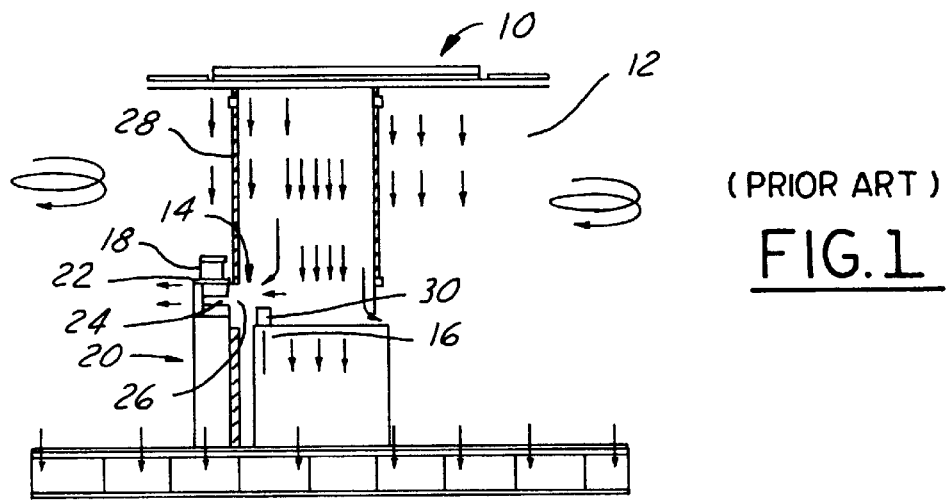
(PRIOR ART)
FIG.1
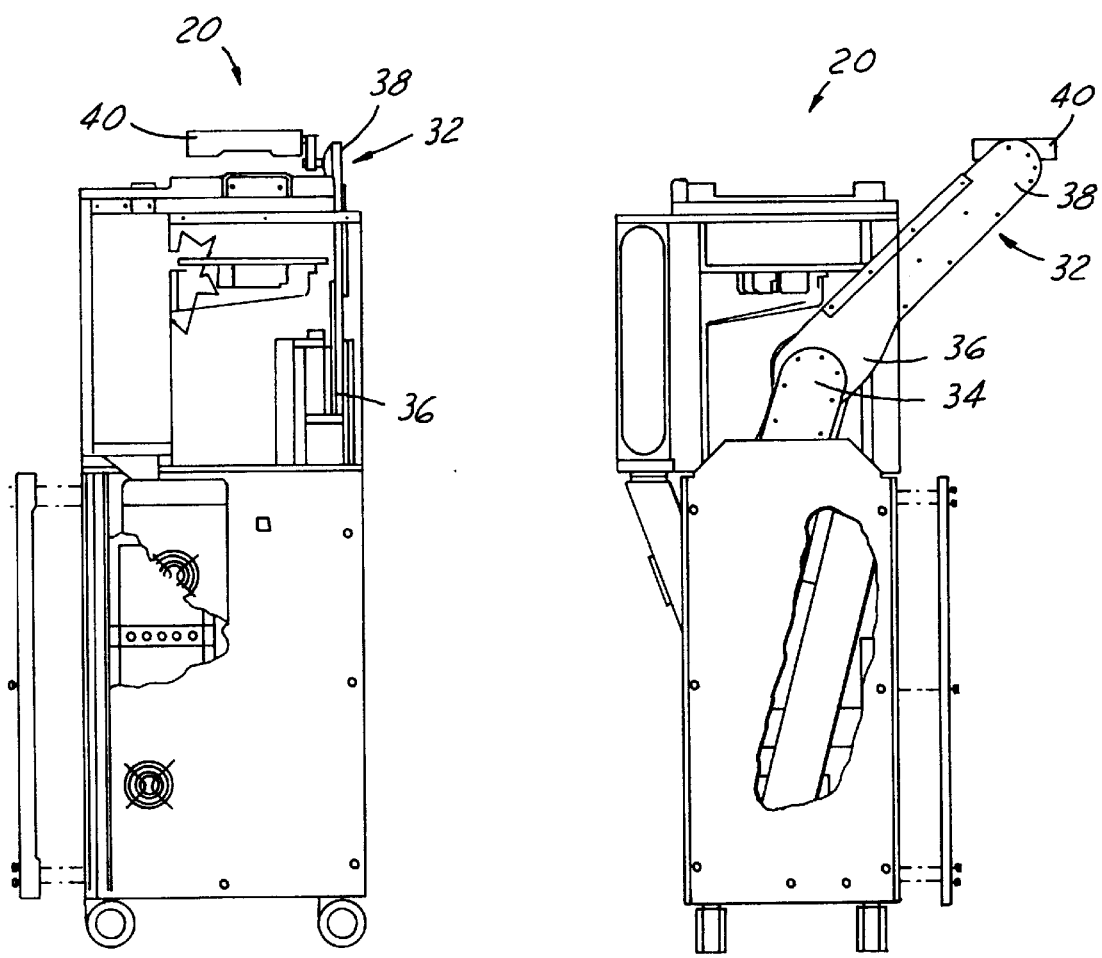
(PRIOR ART)
FIG.2A
(PRIOR ART)
FIG.2B

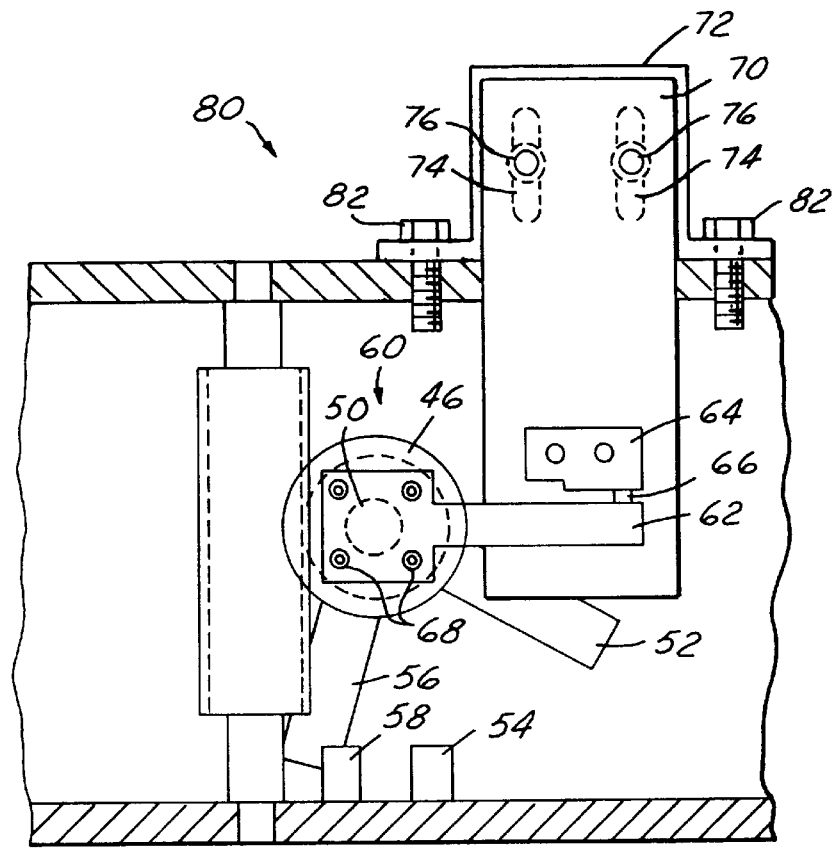
FIG.4A
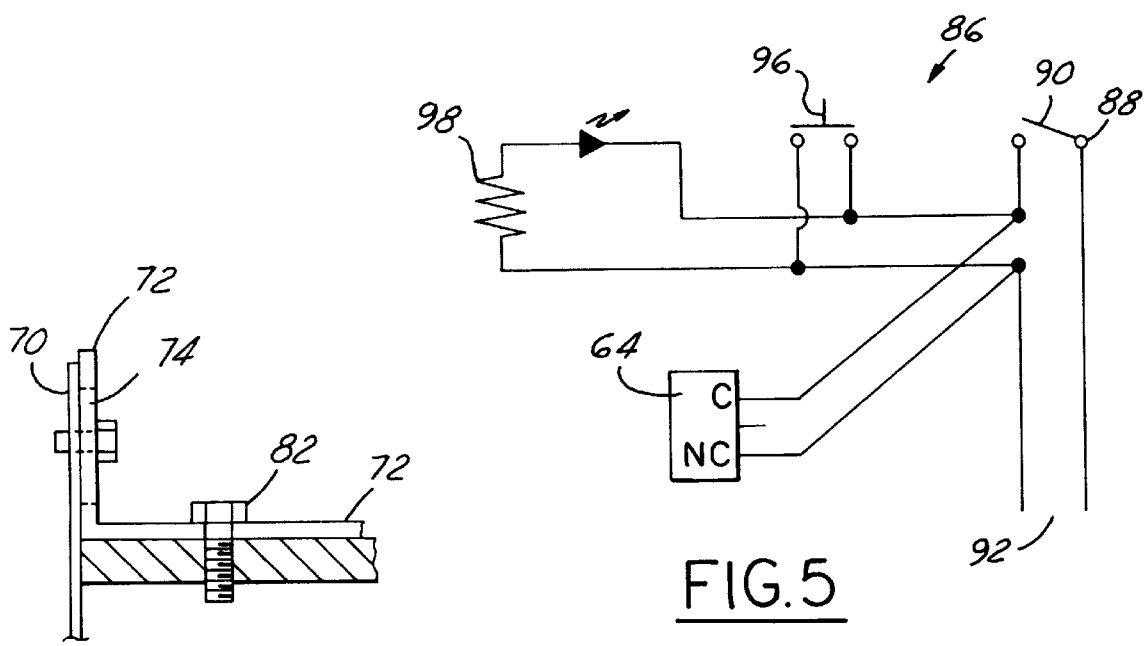
FIG.4B
FIG.5

APPARATUS FOR AUTOMATED LOADING OF WAFER CASSETTE

FIELD OF THE INVENTION

The present invention generally relates to an apparatus for the automated loading of a wafer cassette and more particularly, relates to an apparatus for preventing over-tilt of a cassette loader during an automated wafer cassette loading process by utilizing an additional sensor arm and a micro-switch such that the power supply to the loader can be interrupted prior to an over-tilt position of the loader is reached.

BACKGROUND OF THE INVENTION

In the recent development of semiconductor fabrication technology, the continuous miniaturization in IC devices demands more stringent requirements in the fabrication environment and contamination control. When the feature size was in the 2 μm range, a cleanliness class of 100~1000 (which indicates the number of particles at sizes larger than 0.5 μm per cubic foot of air) was sufficient. However, when the feature size is reduced to 0.25 μm, a cleanliness class of 0.1 is required. It was recognized that an inert mini-environment may be the only solution to future fabrication technologies when the device size is further reduced. In order to eliminate micro-contamination and to reduce native oxide growth on silicon surfaces, the wafer processing and the loading/unloading procedures of a process tool must be enclosed in an extremely high cleanliness mini-environment that is constantly flushed with ultrapure nitrogen that contains no oxygen and moisture.

Different approaches in modern clean room design have been pursued in recent years with the advent of the ULSI technology. One approach is the utilization of a tunnel concept in which a corridor separates the process area from the service area in order to achieve a higher level of air cleanliness. Under the concept, the majority of equipment maintenance functions are conducted in low-classified service areas, while the wafers are handled and processed in more costly high-classified process tunnels. For instance, in a process for 16M and 64M DRAM products, the requirement of contamination control in a process environment is so stringent that the control of the enclosure of the process environment for each process tool must be considered.

The stringent requirement creates a new mini-environment concept which is shown in FIG. 1. Within the enclosure of the mini-environment of a process tool 10, an extremely high cleanliness class of 0.1 (which means the number of particles at sizes larger than 0.1 μm per cubic foot of air) is maintained, when compared to a cleanliness class of 1000 for the overall production clean room area 12. In order to maintain the high cleanliness class inside the process tool 10, the loading and unloading sections 14 of the process tool must be handled automatically by an input/output device such as a SMIF (standard mechanical interfaces) apparatus. A cassette of wafer can be transported into the process tool 10 by a SMIF pod 18 situated on top of the SMIF apparatus In a conventional SMIF apparatus 20 such as that shown in FIG. 1, the apparatus 20 consists of a robotic arm or a rotating arm 32 (shown in FIGS. 2A and 2B) which is normally configured for gripping the top of a cassette 30 from a platform on which the cassette 30 is placed (inside a pod). The rotating arm 32, which is equipped with a gripper assembly 40 at one end, is capable of transporting the cassette 30 into the process tool and place it onto a platform 16 vertically such that the cassette 30 is oriented horizontally. At the beginning of the process, an operator positions a SMF pod 18 on top of a platform/elevator 22 which contains a cassette 30 holding, for instance, 24 wafers in an upright position. The elevator then descends into the SMIF apparatus 20 for the rotating arm 32 to transport the cassette 30 into the process tool. The SMIF system 20 therefore utilizes clean isolation technology to maintain a high class clean room effectiveness near wafers and processing equipment. The operation of the robotic arm 32 or the gripper assembly 40 is controlled by an ancillary computer (not shown) of the process tool 10. The cassette 30 carries wafers or other substrates that are being processed.

The SMIF apparatus 20 has a port (or opening) 24 which is intimately mated with an opening 26 in the sidewall 28 of the process tool 10. The SMIF pod 18 is a sealed container with an opening at the bottom and is capable of preventing contamination to the cassette held therein. The pod may also be equipped by a tagging system for the automated identification and recognition of the parts contained in the pod to prevent mis-processing, of the wafers and to track through the host computer of the product-lot serial numbers. The tagging system is mounted on the pod, while a probe assembly is mounted on the port of the SMIF apparatus 20. The SMIF apparatus 20 is therefore an effective interface between an operator and the process tool 10 in that the transporting of cassette can be conducted in a completely automated fashion to avoid human contact by the operator. This insures that the cassette 30 is transported through a highly clean environment into the process tool 10.

Occasionally, the SMIF apparatus 20 or the process tool 10 requires repair or maintenance procedures to be performed on them. When one of such needs arises, the SMIF apparatus 20 must be disassembled from the process tool 10 and be physically pushed away in order to provide access to an operator for performing the repair or maintenance.

A rear view and a side view of the SMIF apparatus 20 is shown in FIGS. 2A and 2B, respectively. The robotic arm or rotating arm 32 is mounted to the SMIF apparatus 20 through an aperture 34 (shown in FIG. 3A) at the lower end 36. The upper end 38 is equipped with a gripper assembly 40. The gripper assembly 40 is operated by a chain drive 42 for tilting of the gripper assembly 40 when holding a wafer cassette 30. The motion of the gripper assembly 40 of being raised up or down is controlled by the rotating arm 32. It should be noted that in FIG. 3A, only the chain drive 42 is shown for the rotating arm 32 for simplicity reasons.

The rotating motion of the rotating arm 32 is controlled by a worm gear 46 and a worm 48. The worm gear 46 is rigidly fixed to a shaft 50 mounted through the aperture 34 at the lower end 36 of the rotating arm 32. To control the motion of the rotating arm 32, an upward-tilt sensor arm 52 and opto-electrical sensor 54 are used to control the extreme upward tilt position. The extreme downward tilt position is controlled by the downward-tilt sensor arm 56 and the opto-electrical sensor 58. The sensor arms 52, 56 are mounted coaxially with the rotating arm 32 by frictional engagement to the shaft 50. A detailed view of the worm gear 46 and the worm 48, and the sensor arms 52 and 56 are shown in FIG. 3B.

The operation of the tilt control device for the gripper assembly 40 can be explained in FIG. 3B. It should be noted that the view presented in FIG. 3B is of a mirror image of that shown in FIG. 3A since the view in FIG. 3B is taken from a direction opposite to that taken for FIG. 3A. The positioning of the sensor arms 52, 56 and the opto-electrical sensors 54, 58 are therefore reversed in the two Figures. During a normal operation, the gripper assembly 40 and the wafer cassette 30 swings upwardly to properly seat all the wafers (not shown) in the cassette 30 so that the cassette can be later fitted into a pod without breaking the wafers that may be improperly seated and therefore protruding from the cassette top. Once the wafers are properly seated into the wafer cassette 30, the gripper assembly 40 tilt downwardly to a normal horizontal position. The extreme downward-tilt position is controlled by the up-tilt sensor arm 56 and the opto-electrical sensor 58, while the extreme upward-tilt position is controlled by the downward-tilt sensor arm 52 and the opto-electrical sensor 54. When the opto-electrical sensor 58 is triggered by the sensor arm 56, it is an indication that the extreme downward-tilt position has been reached. Similarly, when the opto-electrical sensor 54 is triggered by the sensor arm 52, it is an indication that the extreme position of the upward-tilt of the gripper assembly 40 has been reached.

Under normal operation conditions, the extreme downward-tilt position is the position where the gripper assembly 40 is returned to a horizontal position. However, it has been observed that an over downward-tilt motion of the gripper assembly 40 can occur as a result of a failure of the downward-tilt sensor arm 56 to trigger the downward-tilt opto-electrical sensor 58. This failure of the sensor mechanism to stop the gripper assembly 40 from over-tilting creates serious problems. The wafers contained in the cassette 30 may slide out of the cassette when it is positioned in an over-tilt position and cause breakage of the wafers. The over-tilt problem may be caused by several reasons. First, since the sensor arm 56 is attached to the shaft 50 of the worm gear 46 by frictional engagement, the sensor arm 56 may become loose on the shaft and shift away from its correct position. The sensor arm 56 may have been mounted in a wrong position after a maintenance procedure has been performed on the sensor mechanism and thus causing a malfunction between the sensor arm 56 and the opto-electrical sensor 58. Secondly, the existence of any bugs in the control program for the rotating arm may cause malfunction of the arm during a downward-tilt motion. Thirdly, the opto-electrical sensor 58 may not function properly and thus fails to stop the downward-tilt motion of the rotating arm.

It is therefore an object of the present invention to provide an apparatus for preventing the over-tilt of a gripper assembly in a cassette loader that does not have the drawbacks and shortcomings of the conventional over-tilt protection devices.

It is another object of the present invention to provide an apparatus for preventing the over-tilt of a gripper assembly in a cassette loader that does not require the alteration of the control programming for the cassette loader.

It is a further object of the present invention to provide an apparatus for preventing the over-tilt of a gripper assembly in a cassette loader by the addition of an independent sensor system for preventing the occurrence of over-tilt of the rotating arm.

It is another further object of the present invention to provide an apparatus for preventing over-tilt of a gripper assembly in a cassette loader by providing a mechanical stop which functions to prevent over-tilt even when the additional apparatus fails to detect the over-tilt.

It is still another object of the present invention to provide an apparatus for preventing the over-tilt of a gripper assembly in a cassette loader by utilizing an additional sensor system that is permanently affixed to the rotating arm shaft that would not come loose on the shaft.

It is yet another object of the present invention to provide an apparatus for preventing the over-tilt of a gripper assembly in a cassette loader by providing an apparatus that can be installed and adjusted easily on the rotating arm assembly.

It is still another further object of the present invention to provide an apparatus for preventing the over-tilt of a gripper assembly in a cassette loader that will stop the motion of the loader instantaneously when the additional sensor system is triggered.

It is yet another further object of the present invention to provide an apparatus for preventing the over-tilt of a gripper assembly in a cassette loader that also provides a warning signal to indicate to a machine operator the existence of an over-tilt condition.

It is still another further object of the present invention to provide an apparatus for preventing an over-tilt of a gripper assembly in a cassette loader that does not require an excessive modification of the rotating arm assembly.

It is yet another further object of the present invention to provide an apparatus for preventing the over-tilt of an gripper assembly in a cassette loader that also provides a manual override device such that a machine operator may temporarily override the power-down condition of the gripper assembly and thus returning the gripper to a safe position without disassembling the rotating arm assembly.

SUMMARY OF THE INVENTION

The present invention provides an apparatus for preventing the over-tilt of a gripper assembly in a cassette loading machine by utilizing an additional sensor device rigidly mounted to a worm gear assembly that controls the rotating motion of the gripper assembly such that either an opto-electrical sensor will be bypassed by the additional sensor arm and thus interrupting the power supply to the gripper assembly and stops its motion, or the additional sensor device may function as a mechanical stop to mechanically stop the rotational motion of the rotating arm. The present invention apparatus may also include a warning device that alerts a machine operator of the triggered condition of the additional sensor assembly for any remedial action required. The present invention apparatus may further include a manual override device such that the machine operator may temporarily restore power to the machine and thus returning the gripper assembly to a safe position without damaging wafers in the wafer cassette.

In a preferred embodiment, an apparatus for preventing the over-tilt of a gripper assembly in a cassette loading machine is provided which includes a rotating arm that has a center aperture at one end mounted to a shaft for allowing a rotational motion of the arm and a cassette gripper at the other end for gripping a wafer cassette, a sensor arm rigidly mounted to the shaft for moving unitarily with the gripper assembly in a rotational motion, and a micro-switch for switching by the sensor arm at an angle just before the over-tilt position is reached such that power supply is interrupted for stopping the motion.

In another preferred embodiment, the present invention also provides an apparatus for loading wafer cassette that includes a rotating arm that has a center aperture for mounting to a shaft at one end for rotational motion of the arm and a cassette gripper mounted at the other end for gripping a wafer cassette, a first sensor arm frictionally engaging the shaft for moving with the rotating arm in a rotational motion, an opto-electrical sensor for triggering by the first sensor arm for indicating a maximum upward-tilt position of the rotating arm, a second sensor arm rigidly mounted to the shaft for moving unitarily with the rotating arm in a rotational motion, an electrical switch for switching by the second sensor arm at an angle just prior to an over-tilt position of the cassette gripper is reached such that power to the rotating arm is interrupted to stop the motion of the rotating arm.

BRIEF DESCRIPTION OF THE DRAWINGS

These and other objects, features and advantages of the present invention will become apparent from the following detailed description and the appended drawings in which:

FIG. 1 is an illustration of a cross-section of a conventional semiconductor process tool that has a wafer loading device attached thereto.

FIG. 2A is a rear view of a conventional wafer loading device.

FIG. 2B is a side view of a conventional wafer loading device.

FIG. 4A is a schematic illustrating the present invention apparatus of the additional sensor assembly which further functions as a mechanical stop.

FIG. 4B is a cross-sectional view of a mounting plate for the present invention additional sensor assembly of FIG. 4A.

FIG. 5 is a circuit diagram illustrating the control circuit for the present invention additional sensor assembly.

DETAILED DESCRIPTION OF THE PREFERRED EMBODIMENT

The present invention discloses an apparatus for preventing the over-tilt condition of a rotating arm in an automated cassette loading device from occurring by utilizing an additional sensor assembly which is rigidly attached to the rotating shaft of the rotating arm such that it does not come loose and malfunction and furthermore, in addition to the triggering of an opto-electrical sensor for interrupting the power supply to the rotating arm, the additional sensor system also functions as a mechanical stop to force the rotational motion of the arm to stop even when the opto-electrical sensor fails. The present invention apparatus may further include a warning system of either a flashing light or a bell for alerting an machine operator for taking remedial action when such over-tilt condition exists. The present invention apparatus may further include a manual override which enables the machine operator to temporarily restore a power supply to the rotating arm after it is shut off by the sensor system when an over-tilt condition is sensed such that the position of the rotating arm can be returned to a safe position for preventing wafers from falling out of the wafer cassette. A suitable electrical switch used in the present invention additional sensor system is a micro-switch that is in a normal-closed position.

The present invention also discloses an apparatus for automatically loading a wafer cassette that includes a rotating arm mounted to a shaft at one end and equipped with a cassette gripper at the other end, a first sensor arm frictionally engaging the shaft and an opto-electrical sensor for triggering by the first sensor arm for indicating a maximum upward-tilt position of the arm, a second sensor arm that is rigidly mounted to the shaft for moving unitarily with the rotating arm in a rotational motion, and an electrical switch for switching by the second sensor arm when an over-downward-tilt position is detected for interrupting the power supply to the rotating arm, and for acting as a mechanical stop to prevent the further movement of the arm in a downward direction.

Figure 3A:
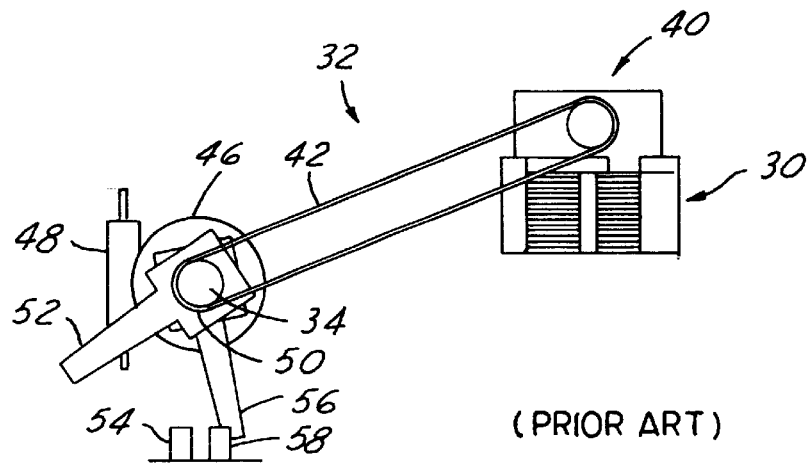
FIG. 3A is an illustration of a rotating arm having an upward-tilt and a downward-tilt sensor mechanisms at one end and a gripper assembly/cassette on the other end.
Figure 3B:
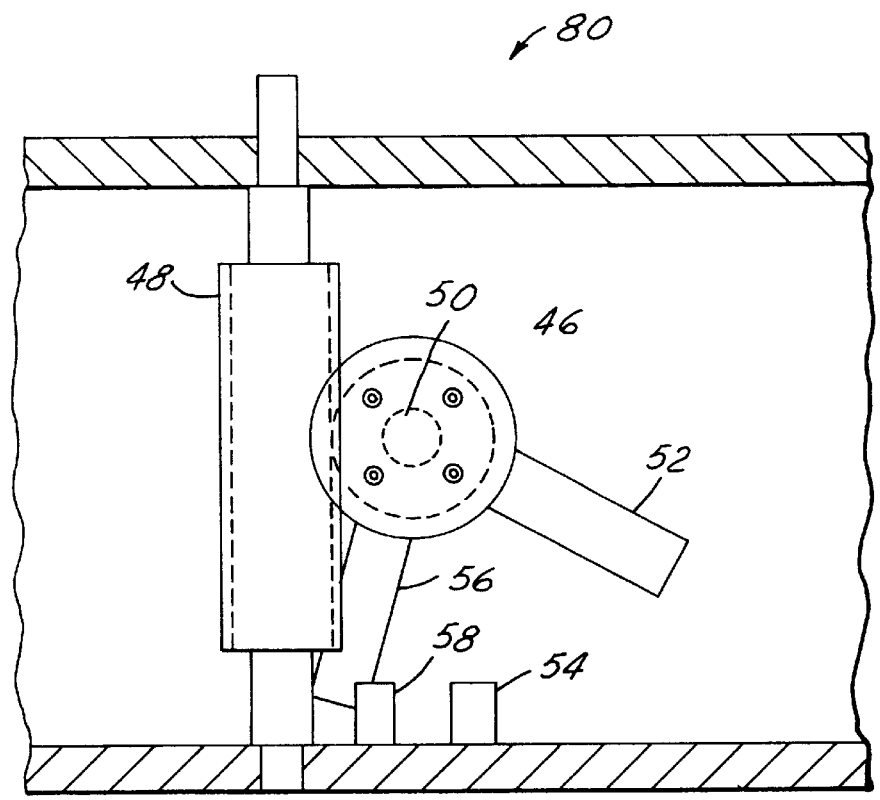
FIG. 3B is an enlarged view of the upward-tilt and the downward-tilt mechanism shown in FIG. 3A.

Referring now to FIG. 4A, where it is shown a cross-sectional view of the present invention sensor assembly 60 which includes a third sensor arm 62 and a micro-switch 64. The third sensor arm 62 is rigidly attached to the worm gear 46 through the shaft 50 by four screws 68. The functions of the first sensor arm 52, the second sensor arm 56 and the opto-electrical sensors 54, 58 are similar to that shown in the conventional set-up of FIG. 3B. The present invention novel sensor system 60 provides an additional sensor system in addition to the downward-tilt sensing system of the sensor arm 56 and the opto-electrical sensor 58. The present invention additional sensor system 60 functions only when the downward-tilt sensor arm 56 and the opto-electrical sensor 58 fail to function properly and to interrupt the power supply to the rotating arm 32. For instance, when the sensor arm 56 passes the position that it normally trippers the opto-electrical sensor 58 without triggering, the additional sensor system 60 provided by the present invention novel apparatus will function in the following manner. First, the sensor arm 62 of the present invention sensor system 60 will come in contact with the switch 64 at the contact point 66. A suitable switch 64 can be advantageously a micro-switch of a normal-closed position. In other words, the micro-switch 64, when not triggered at contact point 66, allows a current to flow through the rotating arm control circuit such that the arm can function properly and be controlled by the sensor arms 52 and 56. However, when the downward-tilt sensor arm 56 and the opto-electrical sensor 58 fail to function properly and to stop the rotating arm in a downward-tilt motion, the sensor arm 62 triggers the micro-switch 64 and therefore opens the circuit and thus interrupting the power supply to the whole machine.

The present invention novel sensor system 60 further provides the benefit that, even when the sensor arm 62 and the micro-switch 64 fail to function by opening the circuit and thus preventing the motion of the gripper assembly, the contact point 66 on the micro-switch 64 functions as a mechanical stop to mechanically stop the rotational motion of shaft 50 by stopping the sensor arm 62. This is very desirable since it provides an added insurance that the rotating arm would not further tilt in a downward direction and thus endangering the wafers it carries in the cassette. Since the rotating arm in a SMIF loader is normally operated by a step motor, even when it is forced to manual stop, the motor does not generate an excessive current and does not destroy the motor coil. In any event, since the cost of wafers greatly exceeds the cost of a replacement motor, the mechanical stop function of the present invention sensor system 60 is a desirable feature even when the motor may be damaged. Furthermore, the mechanical stop function of the present invention system 60 only becomes effective when both the conventional sensor arm 56 and the present invention sensor arm 62 fail to function. The occurrence of such is extremely rare. The present invention sensor arm 60 is rigidly attached to the worm gear 46 by four screws 68. This is a significant improvement over that of the conventional attachment method for the sensor arm 56, i.e., by a frictional engagement with shaft 50. The chances of the sensor arm 62 slipping on the shaft 50 is therefore non-existent. The attachment method of the present invention sensor arm 60 also provides the additional benefit that the arm 62 can be attached exteriorly to the worm gear 46 at one end without the necessity of disassembling the complete drive system for the rotating arm.

FIG. 4B shows a schematic for the installation of a support plate 70 for mounting the micro-switch 64. It is seen that the support plate 70 is mounted to a backing plate 72 through elongated slots 74 by bolts 76. This allows an easy adjustment of the position of the mounting plate 70 in relation to the backing plate 72. The backing plate 72 is further mounted to the rotating arm assembly 80 by bolts 82.

The operation of the present invention sensor assembly 60 can be explained by the circuit diagram 86 shown in FIG. 5. In the circuit diagram 86, when the rotating arm assembly functions normally, i.e., the micro-switch 64 is on (or closed), the current flows from the current source 88 by turning on switch 90 to the micro-switch 64 in a closed position, and then to the relay 92 for triggering. When the system operates in an override condition, with the micro-switch in an off position, the current flow from the current source 88, through the warning device 94 which is shown as a light emitting diode in FIG. 5, through a 1.5 k ohm resistor 98, and then to the relay 92 in a non-triggered position. In this mode of operation, the manual override button 96 and the micro-switch 64 are both open. To manually override the off position stated above, the button 96 is pressed which allows a current to flow from the current source 88 to the relay 92 and thus triggering the relay.

As shown in FIG. 5, when the micro-switch 64 is triggered to open the circuit, the current is forced to flow through the large resistor 98 and the light emitting diode 94. Since the current used is a small current of 10 mA, it is only sufficient to activate the light emitting diode 94 and not sufficient to drive the machine. The result of having a warning device 94 activated and a power supply interrupted is therefore achieved. When the manual override button 94 is pressed, it enables a temporary resumption of power to the system. A machine operator, during a tilt-override and power interruption, can thus resume a power supply to the rotating arm such that the arm can be returned to a safe position eliminating the danger that the wafers may be dropped from the cassette.

The desirable benefits achieved by the present invention apparatus have therefore been amply demonstrated by the above descriptions and the appended FIGS. 4A, 4B and 5. To summarize, the present invention provides the desirable benefits that, in the event the conventional downward-tilt sensor system fails, the present invention additional sensor system provides an added insurance that an over-tilt does not occur and thus, the possibility of wafers falling off and damages can be eliminated. Furthermore, the present invention apparatus can be easily installed to an existing machine and can be easily adjusted and maintained. The present invention apparatus further provides the benefit that, by utilizing a manual override button, a machine operator can return the rotating arm to a safe position such that the dropping of the wafers can be avoided and the problems can be corrected.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. An apparatus for preventing over-tilt of a rotating arm in a cassette loader comprising:
    an arm having a center aperture at one end mounted to a shaft for rotational motion of the arm and a cassette gripper at the other end for gripping a wafer cassette,
    a first sensor arm rigidly mounted to said shaft for moving unitarily with said rotating arm in a rotational motion for sensing a maximum downward tilt position,
    a second sensor arm rigidly mounted to said shaft for moving unitarily with said rotating arm in a rotational motion for sensing a maximum downward tilt position, said second sensor arm functions only when said first sensor arm fails to sense the maximum downward tilt position, and
    a switch for switching by said second sensor arm at a position just before said over-tilt position is reached such that power supply to said rotating arm is interrupted for stopping the motion of the arm.

2. An apparatus for preventing over-tilt of a cassette loader according to claim 1, wherein said cassette loader is a standard mechanical interfaces machine.

3. An apparatus for preventing over-tilt of a cassette loader according to claim 1, wherein said switch is a micro-switch.

4. An apparatus for preventing over-tilt of a cassette loader according to claim 1, wherein said switch is a normal-closed micro-switch.

5. An apparatus for preventing over-tilt of a cassette loader according to claim 1, wherein said switch further serves the function of a mechanical stop.

6. An apparatus for preventing over-tilt of a cassette loader according to claim 1, wherein said shaft is unitarily mounted to a worm gear.

7. An apparatus for preventing over-tilt of a cassette loader according to claim 1, wherein said shaft is unitarily mounted to a worm gear for movement on a worm.

8. An apparatus for preventing over-tilt of a cassette loader according to claim 1 further comprising a warning device which is activated when said switch is switched and said power supply to the rotating arm is interrupted.

9. An apparatus for preventing over-tilt of a cassette loader according to claim 1 further comprising a manual override device for restoring a power supply to the rotating arm after said switch is switched and said power supply is interrupted.

10. An apparatus for loading a wafer cassette comprising:
    a gripper assembly having a center aperture for mounting to a shaft at one end for rotational movement of the arm and a cassette gripper mounted at the other end for gripping a wafer cassette,
    a first sensor arm frictionally engaging said shaft for moving with said gripper assembly in a rotational motion,
    an opto-electrical sensor for triggering by said first sensor arm for indicating a maximum upward-tilt position of said rotating arm,
    a second sensor arm rigidly mounted to said shaft for moving unitarily with said rotating arm in a rotational motion, and
    a switch for switching by said second sensor arm at a position just prior to an over-tilt position of said cassette gripper is reached such that power supply to said rotating arm is interrupted to stop the motion of the rotating arm.

11. An apparatus for loading a wafer cassette according to claim 10, wherein said position just prior to an over-tilt position of said cassette gripper is reached is a maximum downward-tilt position.

12. An apparatus for loading a wafer cassette according to claim 10, wherein said switch further serves the function of a mechanical stop for stopping said rotating arm from making further downward motion.

13. An apparatus for loading a wafer cassette according to claim 10, wherein said switch is a micro-switch.

14. An apparatus for loading a wafer cassette according to claim 10, wherein said switch is a normal-closed micro-switch.

15. An apparatus for loading a wafer cassette according to claim 10, wherein said shaft is unitarily mounted to a worm gear.

16. An apparatus for loading a wafer cassette according to claim 10, wherein said shaft is rigidly mounted to a worm gear for rotational movement by engaging a worm.

17. An apparatus for loading a cassette loader according to claim 10 further comprising a warning device which is activated when said switch is switched and said power supply to the rotating arm is interrupted.

18. An apparatus for loading a cassette loader according to claim 10 further comprising a manual override device for use to restore power supply to the rotating arm after said switch is switched and said power supply is interrupted.

* * * * *